(12) United States Patent
Hu et al.

(10) Patent No.: US 9,214,612 B1
(45) Date of Patent: Dec. 15, 2015

(54) LENS WITH DIFFUSION LAYER AND LED MODULE USING THE SAME

(71) Applicant: HON HAI PRECISION INDUSTRY CO., LTD., New Taipei (TW)

(72) Inventors: Chau-Jin Hu, New Taipei (TW);
Feng-Yuen Dai, New Taipei (TW);
Po-Chou Chen, New Taipei (TW);
Yung-Lun Huang, New Taipei (TW);
Li-Ying Wang He, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/527,970

(22) Filed: Oct. 30, 2014

(30) Foreign Application Priority Data

Sep. 25, 2014 (TW) .............................. 103133182 A

(51) Int. Cl.
| | | |
|---|---|---|
| H01L 33/00 | (2010.01) | |
| H01L 33/58 | (2010.01) | |
| H01L 31/054 | (2014.01) | |
| H01L 33/60 | (2010.01) | |
| H01L 33/52 | (2010.01) | |

(52) U.S. Cl.
CPC ............ *H01L 33/58* (2013.01); *H01L 31/0543* (2014.12); *H01L 33/60* (2013.01); *H01L 33/52* (2013.01)

(58) Field of Classification Search
CPC ... H01L 33/58; H01L 31/054; H01L 51/5275; H01L 27/14627
See application file for complete search history.

(56) References Cited

U.S. PATENT DOCUMENTS

| | | | | |
|---|---|---|---|---|
| 2011/0121341 | A1* | 5/2011 | Lee et al. | 257/98 |
| 2011/0141731 | A1* | 6/2011 | Chang | 362/235 |
| 2013/0049044 | A1* | 2/2013 | Lee et al. | 257/98 |
| 2013/0250189 | A1* | 9/2013 | Choe et al. | 349/11 |
| 2013/0264538 | A1* | 10/2013 | Oh | 257/13 |

* cited by examiner

*Primary Examiner* — Bilkis Jahan
(74) *Attorney, Agent, or Firm* — Novak Druce Connolly Bove + Quigg LLP

(57) ABSTRACT

A lens includes a transparent body and a light diffusion layer. The transparent body includes a bottom face, a light incident face and a light emerging face opposite to the light incident face. The light diffusion layer is formed at the bottom face of the transparent body and surrounding the light incident face. Light emitted toward the light diffusion layer can be diverged toward the light emerging face to emit out of the lens.

13 Claims, 7 Drawing Sheets

LENS WITH DIFFUSION LAYER AND LED MODULE USING THE SAME

FIELD

The subject matter herein generally relates to a lens and a light emitting diode (LED) module using the lens.

BACKGROUND

A typical LED module includes a substrate, electrodes located on the substrate and at least a light emitting diode (LED) electrically connected to the electrodes. In order to achieve a large illumination area, a lens is provided to match with the LED to modulate the light distribution of the LED. The lens can distributes the light emitted from the LED to thereby illuminate a large area. However, part of the light emitted from the LED is reflected back by light emerging faces of the lens.

BRIEF DESCRIPTION OF THE DRAWINGS

Implementations of the present technology will now be described, by way of example only, with reference to the attached figures.

DETAILED DESCRIPTION OF EMBODIMENTS

Figure 1:
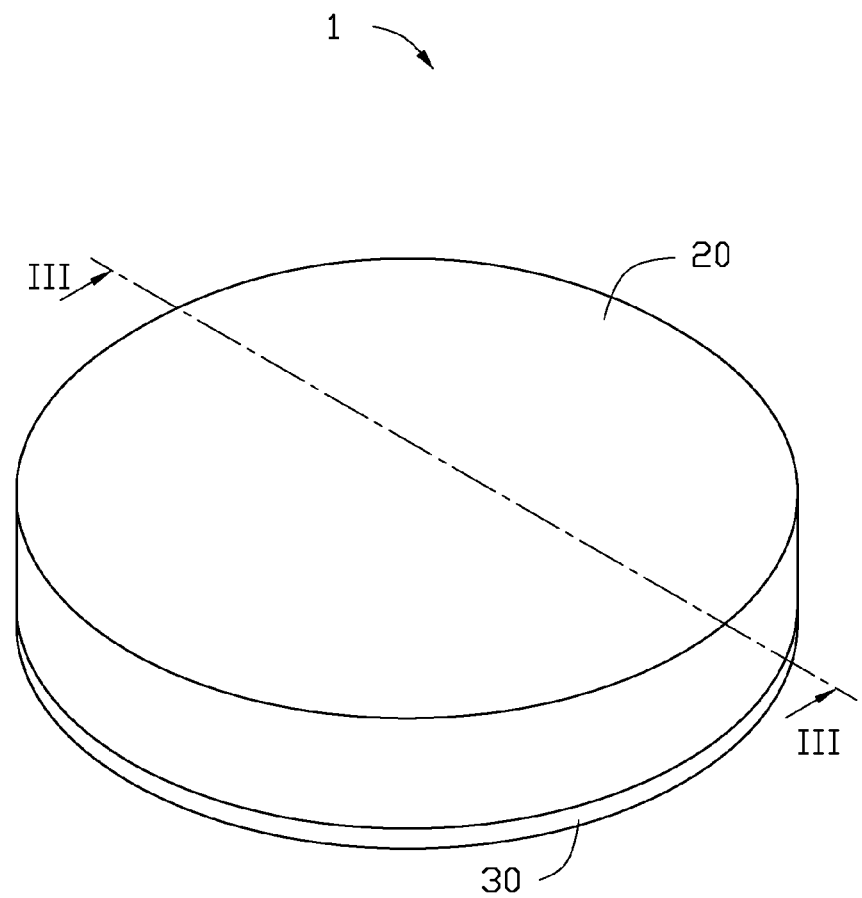
FIG. 1 is an isometric view of a lens in accordance with a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a lens and a LED module using the lens.

Figure 2:
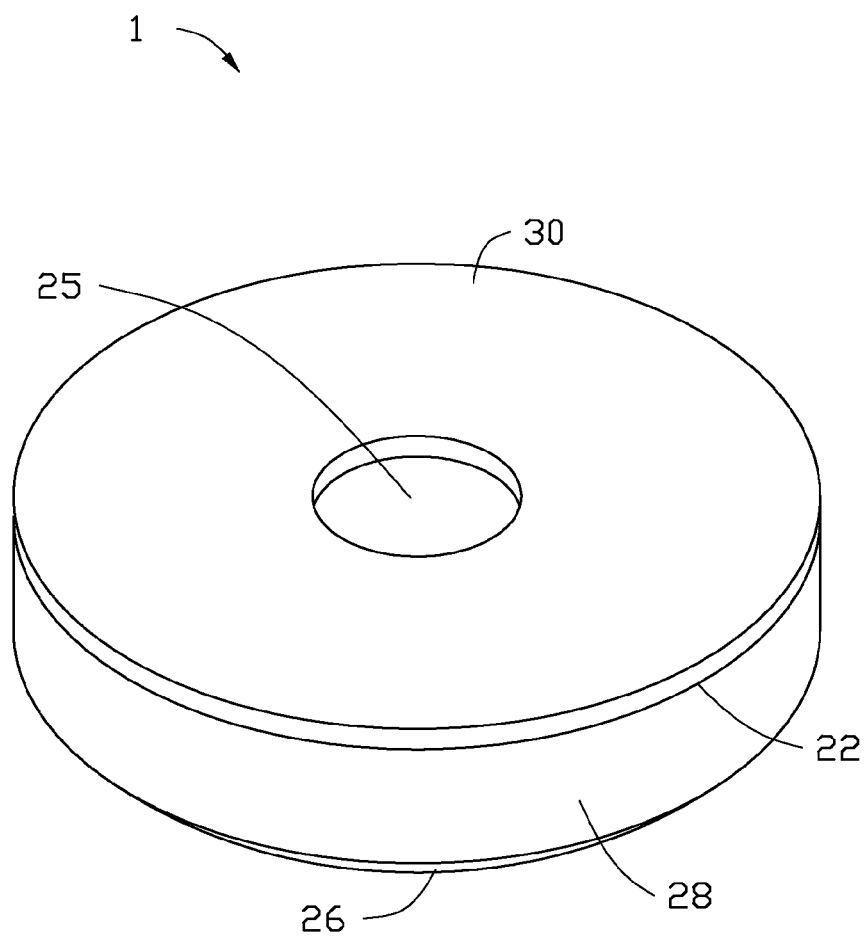
FIG. 2 is an inverted view of the lens of FIG. 1.

Referring to FIGS. 1-2, a lens 1 according to an embodiment of the disclosure is provided. The lens 1 has a substantially cylindrical configuration. The lens 1 includes a transparent body 20 and a light diffusion layer 30 located at a side of the transparent body 20.

Figure 3:
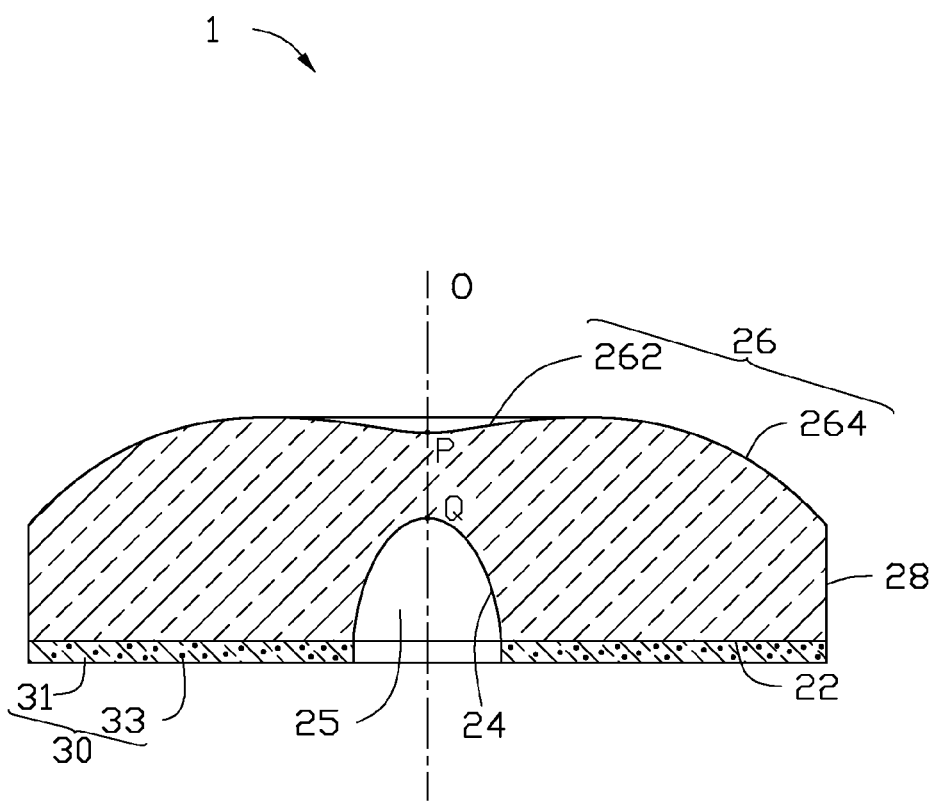
FIG. 3 is a cross-sectional view of the lens of FIG. 1, taken along the III-III line.

Referring to FIG. 3, the transparent body 20 may be made of transparent material such as epoxy, silicone, glass or the like. The transparent body 20 includes a bottom surface 22, a light incident face 24 formed in the bottom surface 22, a light emerging face 26 opposite to the bottom face 22, and a lateral face 28 interconnecting the bottom face 22 and the light emerging face 26. The transparent body 20 has an optical axis O extending through a center of the light incident face 24 and a center of the light emerging face 26.

The bottom face 22 of the transparent body 20 is a flat and circular face. A cavity 25 is defined in a central portion of the bottom face 22. The cavity 25 can be used to receive a light emitting diode 11 (shown in FIG. 4) therein. The cavity 25 has a diameter gradually decreasing from the bottom face 22 towards the light emerging face 26. Inner faces of the cavity 25 function as the light incident face 24 of the transparent body 20. The light incident face 24 is surrounded by the bottom face 22. In at least one embodiment, the light incident face 24 is an elliptical face, and a short axis is in the bottom face 22, and a long axis is perpendicular to the bottom face 22.

The light emerging face 26 is located above the bottom face 22. The light emerging face 26 includes a concave face 262 and a convex face 264 surrounding the concave face 262. The concave face 262 is located at a central area of the light emerging face 26 and opposite to the light incident face 24. A lowest point P of the concave face 262 is aligned with a highest point Q of the light incident face 24. The lowest point P and the highest point Q are located on the optical axis O. The concave face 262 has a curvature less than that of the light incident face 24. The convex face 264 connects the concave face 262 with the lateral face 28. In at least one embodiment, a junction between the concave face 262 and the convex 264 is smooth and curved, and a junction between the convex face 264 and the lateral face 28 is abrupt. The convex face 264 has a bottom lower than a top of the light incident face 24. That is, the bottom of the convex face 264 is lower than the highest point Q of the light incident face 24. The light emerging face 26 can diverge the light from the light incident face 24 to emit out of the transparent body 20, thereby illuminating a large area.

The lateral face 28 directly connects the convex face 264 with the bottom face 22. The lateral face 28 is an annular face perpendicular to the bottom face 22. The lateral face 28 may be further coated with a reflective layer for reflecting the light from the light incident face 24 towards the light emerging face 26.

The light diffusion layer 30 is formed on the bottom face 22 of the transparent body 20. The light diffusion layer 30 can be formed by a way of injection molding.

The light diffusion layer 30 surrounds the cavity 25. In at least one embodiment, the light diffusion layer 30 is annular. Alternatively, the configuration of the light diffusion layer 30 changes can be changed with the configuration of the bottom face 22 of the transparent body 20.

The light diffusion layer 30 covers the bottom face 22 of the transparent body 20. The light diffusion layer 30 is a thin film with a uniform thickness, which can diverge light to different directions. Preferably, a refractive index of the light diffusion layer 30 is larger than that of the transparent body 20, or the refractive index of the light diffusion layer 30 is equal to that of the transparent body 20.

The light diffusion layer 30 includes a main body 31 and plural light diffusion particles 33 doped in the main body 31. The main body 31 can be made of polycarbonate or polymethyl methacrylate. The plural light diffusion particles 33 include organic particles, such as methyl methacrylate, and inorganic particles, such as alumina. Preferably, the particle size varies from 20 um to 100 um.

Figure 4:
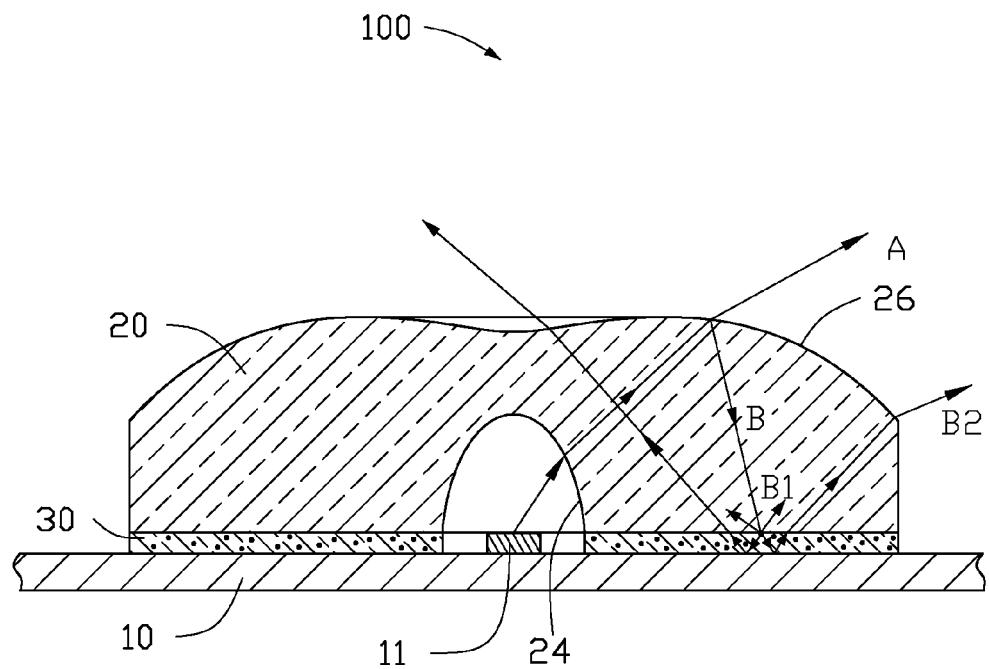
FIG. 4 is a cross-sectional view of a LED module using the lens of FIG. 1 in accordance with an embodiment of the disclosure.

Referring to FIG. 4, this disclosure also relates to a LED module 100, the LED module 100 includes a substrate 10, a light emitting diode 11 mounted on the substrate 10 and a lens 1 for modulating the light illumination of the light emitting diode 11. In at least one embodiment, the lens 1 is fixed onto the substrate 10, and the light diffusion layer 30 directly contacts the substrate 10. The lens 1 can be fixed to the substrate 10 by glue. The light emitting diode 11 is aligned with the cavity 25 of the transparent body 20.

When the LED module 100 is activated, light A emitted from the light emitting diode 11 travels into the transparent body 20 from the light incident face 24, and then, light A is refracted out of the transparent body 20 with a larger illuminating angle.

Light B is reflected by the light emerging face 26, and emits toward the bottom face 22 of the transparent body 20. Light B is diffused by light diffusion particles 33 to emit at least light B1 and light B2. Light B1 emits toward the light emerging face 26 to emit out of the transparent body 20. Light B2 is reflected by the substrate 10 to emit toward the light emerging face 26 to emit out of the transparent body 20.

Figure 5:
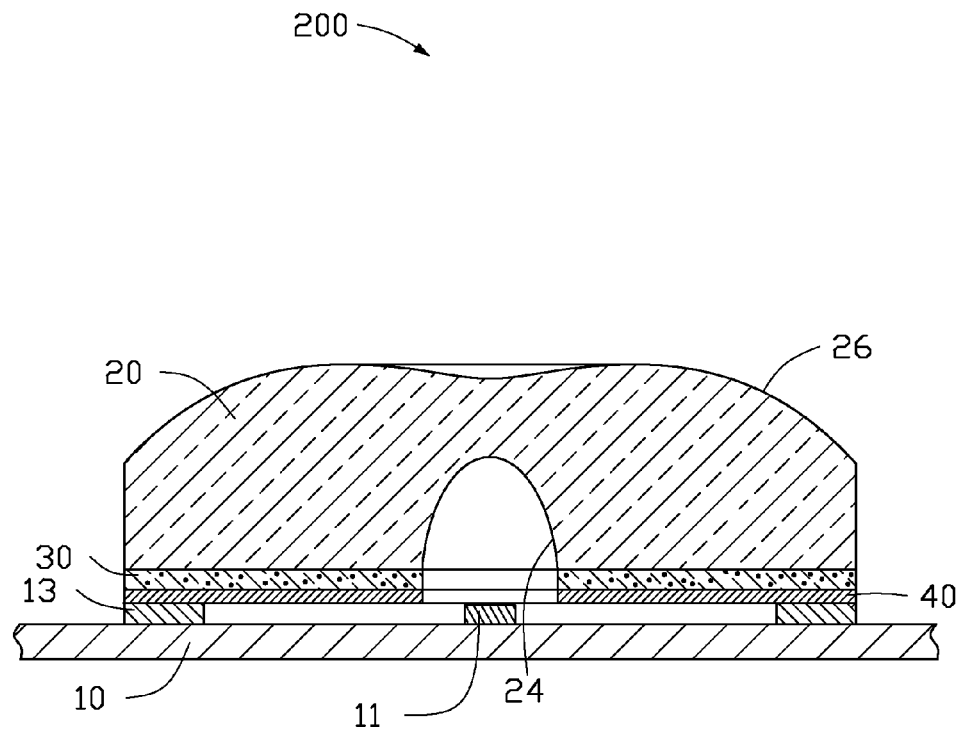
FIG. 5 is a cross-sectional view of a LED module of FIG. 4 having a reflector layer in accordance with another embodiment of the disclosure.

Referring to FIG. 5, in another embodiment, the substrate 10 further includes a supporter 13 supporting the lens 1. The lens 1 is fixed onto the substrate 10 with the supporter 13. The bottom face 22 of the lens 1 is spaced from the substrate 10 to define a gap. A reflector layer 40 may be formed on a bottom face of the light diffusion layer 30. The reflector layer 40 faces toward the substrate 10.

Figure 6:
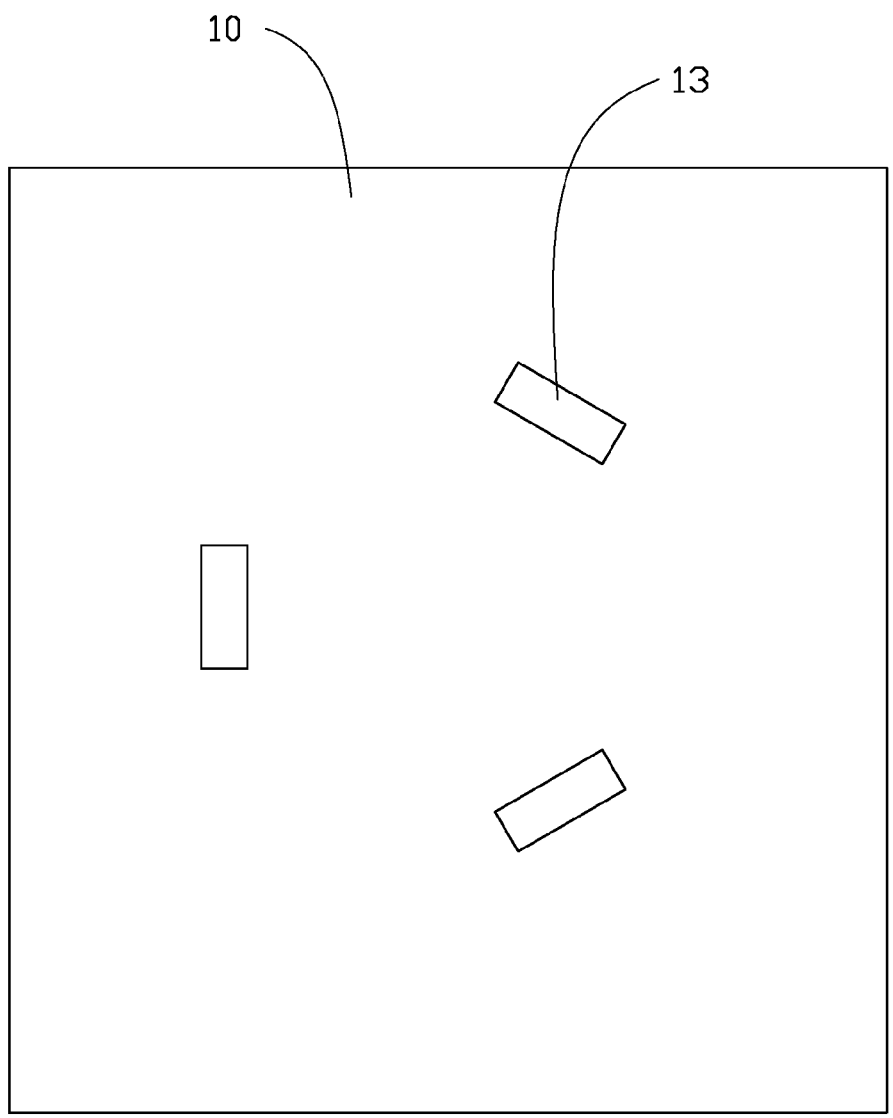
FIG. 6 is a top plan view of a substrate of a LED module of FIG. 4 in accordance with an embodiment of the disclosure.

Referring to FIG. 6, the supporter 13 includes a plurality of protrusions. The protrusions are spaced from each other. Preferably, the number of the protrusions is three, and the protrusions are located at three vertexes of a triangle. Preferably, the protrusions are located in a same circle.

Figure 7:
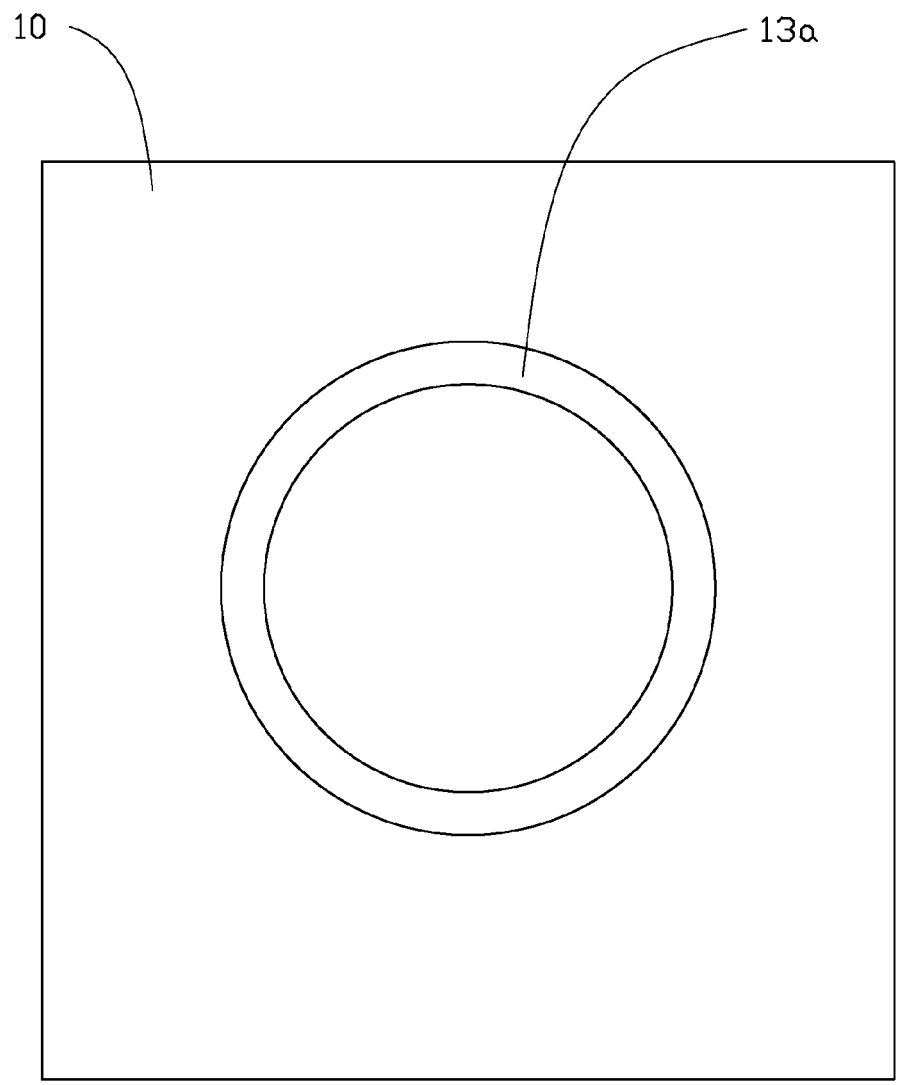
FIG. 7 is a top plan view of another substrate of a LED module of FIG. 4 in accordance with an embodiment of the disclosure.

Alternatively, referring to FIG. 7, the supporter 13 is a continuous configuration. In at least one embodiment, the supporter 13 is ring-shaped, and the supporter 13 supports the lens 1 on the substrate 10.

The embodiments shown and described above are only examples. Many details are often found in the art such as the other features of a lens and a LED module using the lens. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A lens comprising:
a transparent body, the transparent body comprising a bottom face, a light incident face and a light emerging face opposite to the light incident face; and
a light diffusion layer formed at the bottom face of the transparent body and surrounding the light incident face;
wherein a cavity is defined in a central portion of the bottom face of the transparent body, and inner faces of the cavity function as the light incident face.

2. The lens of claim 1, wherein the light diffusion layer is a thin film with a uniform thickness.

3. The lens of claim 1, wherein the light diffusion layer includes a main body and plural light diffusion particles doped into the main body.

4. The lens of claim 3, wherein the particle size of the light diffusion particles varies from 20 um-100 um.

5. The lens of claim 1, wherein the light diffusion layer covers the bottom face of the transparent body.

6. The lens of claim 5, wherein a reflector layer is formed at a bottom face of the light diffusion layer.

7. A light emitting diode module comprising:
a substrate;
a light emitting diode mounted on the substrate; and
a lens fixed onto the substrate to modulate the light emitted from the light emitting diode, wherein the lens includes a transparent body and a light diffusion layer, the transparent body includes a bottom face, a light incident face and a light emerging face opposite to the light incident face, the light diffusion layer is formed at the bottom face of the transparent body and surrounding the light incident face;
wherein a cavity is defined in a central portion of the bottom face of the transparent body, and inner faces of the cavity function as the light incident face.

8. The light emitting diode module of claim 7, wherein a reflector layer is formed at a bottom face of the light diffusion layer to face toward the substrate.

9. The light emitting diode module of claim 7 further comprising a supporter, wherein the supporter supports the lens on the substrate to define a gap between the lens and the substrate.

10. The light emitting diode module of claim 9, wherein the supporter has a ring-shaped configuration.

11. The light emitting diode module of claim 9, wherein the supporter comprises a plurality of protrusions, the protrusions are spaced from each other.

12. The light emitting diode module of claim 11, wherein the plurality of protrusions are located in a circular array.

13. The light emitting diode module of claim 12, wherein the number of the protrusions is three.

* * * * *